United States Patent
Lao et al.

(10) Patent No.: US 10,629,726 B2
(45) Date of Patent: Apr. 21, 2020

(54) HIGH-VOLTAGE SEMICONDUCTOR DEVICE AND METHOD FOR MANUFACTURING THE SAME

(71) Applicant: Vanguard International Semiconductor Corporation, Hsinchu (TW)

(72) Inventors: Chung-Ren Lao, Taichung (TW); Hsing-Chao Liu, Jhudong Township (TW); Chu-Feng Chen, New Taipei (TW); Wei-Chun Chou, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 50 days.

(21) Appl. No.: 14/572,286

(22) Filed: Dec. 16, 2014

(65) Prior Publication Data

US 2016/0172490 A1 Jun. 16, 2016

(51) Int. Cl.
*H01L 29/78* (2006.01)
*H01L 29/66* (2006.01)
(Continued)

(52) U.S. Cl.
CPC .... *H01L 29/7816* (2013.01); *H01L 21/28052* (2013.01); *H01L 21/28105* (2013.01);
(Continued)

(58) Field of Classification Search
CPC ............ H01L 29/402; H01L 29/66681; H01L 29/66689; H01L 29/7816; H01L 29/42328; H01L 29/42344
See application file for complete search history.

(56) References Cited

U.S. PATENT DOCUMENTS 6,222,229 B1 * 4/2001 Hebert ................ H01L 29/0692
257/327
7,894,256 B1 * 2/2011 Nemati .................... G11C 11/39
365/174
(Continued)

FOREIGN PATENT DOCUMENTS

CN 1819270 A 8/2006
CN 101326643 A 12/2008
(Continued)

*Primary Examiner* — Cuong Q Nguyen
*Assistant Examiner* — Peter M Albrecht
(74) *Attorney, Agent, or Firm* — Birch, Stewart, Kolasch & Birch, LLP

(57) ABSTRACT

The present disclosure provides a high-voltage semiconductor device, including: a substrate; an epitaxial layer disposed over the substrate and having a first conductive type; a gate structure disposed over the epitaxial layer; a source region and a drain region disposed in the epitaxial layer at opposite sides of the gate structure respectively; and a stack structure disposed between the gate structure and the drain region, wherein the stack structure includes: a blocking layer; an insulating layer disposed over the blocking layer; and a conductive layer disposed over the insulating layer and electrically connected the source region or the gate structure. The present disclosure also provides a method for manufacturing the high-voltage semiconductor device.

24 Claims, 11 Drawing Sheets

(51) Int. Cl.
*H01L 21/28* (2006.01)
*H01L 29/49* (2006.01)
*H01L 29/40* (2006.01)

(52) U.S. Cl.
CPC ........ *H01L 29/402* (2013.01); *H01L 29/4933* (2013.01); *H01L 29/4983* (2013.01); *H01L 29/665* (2013.01); *H01L 29/66689* (2013.01)

(56) References Cited

U.S. PATENT DOCUMENTS

| | | | |
|---|---|---|---|
| 2005/0280101 A1 | 12/2005 | Babcock et al. | |
| 2008/0308862 A1* | 12/2008 | Theeuwen | H01L 29/402 257/328 |
| 2009/0218622 A1* | 9/2009 | Rijs | H01L 29/0847 257/343 |
| 2012/0228704 A1* | 9/2012 | Ju | H01L 29/402 257/339 |
| 2012/0280319 A1* | 11/2012 | Roehrer | H01L 29/0653 257/337 |
| 2013/0020632 A1* | 1/2013 | Disney | H01L 29/402 257/328 |
| 2013/0134512 A1* | 5/2013 | Cheng | H01L 29/402 257/339 |
| 2013/0277741 A1* | 10/2013 | Guowei | H01L 29/402 257/343 |
| 2014/0197489 A1* | 7/2014 | Chu | H01L 29/7816 257/343 |
| 2014/0346598 A1* | 11/2014 | Han | H01L 29/7835 257/345 |

FOREIGN PATENT DOCUMENTS

| | | |
|---|---|---|
| TW | 201240085 A1 | 10/2012 |
| TW | 201330273 A1 | 7/2013 |

\* cited by examiner

HIGH-VOLTAGE SEMICONDUCTOR DEVICE AND METHOD FOR MANUFACTURING THE SAME

CROSS REFERENCE TO RELATED APPLICATIONS

BACKGROUND

Technical Field

The disclosure relates to a semiconductor device and a method for manufacturing the same, and in particular to a high-voltage semiconductor device and a method for manufacturing the same.

Description of the Related Art

High-voltage semiconductor devices are applied to integrated circuits with high voltage and high power. Traditional high-voltage semiconductor devices, for example a vertically diffused metal oxide semiconductor (VDMOS) or a laterally diffused metal oxide semiconductor (LDMOS), are mainly used for devices with at least 18 volts or higher. The advantages of high-voltage device technology include cost effectiveness and process compatibility. High-voltage device technology has been widely used in display driver IC devices, power supply devices, power management fields, communications fields, autotronics fields, industrial control fields, etc.

High-voltage semiconductor devices utilize the gate voltage to generate a channel and to control the current between source and drain. To prevent punch-through between source and drain in traditional high-voltage semiconductor devices, the channel length of the transistor must be increased. However, as the channel length increases, the device size increases, such that the chip area increases and the on-resistance ($R_{on}$) of the transistor increases. In addition, since the mobility of the hole is lower than the electron, the on-resistance of the P-type high-voltage semiconductor devices is higher than the N-type high-voltage semiconductor devices, which is unfavorable for improving the P-type high-voltage semiconductor devices.

Therefore, a high-voltage semiconductor device structure which may solve the above problem is needed.

SUMMARY

The present disclosure provides a high-voltage semiconductor device, including: a substrate; an epitaxial layer disposed over the substrate and having a first conductive type; a gate structure disposed over the epitaxial layer; a source region and a drain region disposed in the epitaxial layer at opposite sides of the gate structure respectively; and a stack structure disposed between the gate structure and the drain region, wherein the stack structure includes: a blocking layer; an insulating layer disposed over the blocking layer; and a conductive layer disposed over the insulating layer and electrically connected to the source region or the gate structure.

The present disclosure also provides a method for manufacturing a high-voltage semiconductor device, including: providing a substrate; forming an epitaxial layer over the substrate, wherein the epitaxial layer has a first conductive type; forming a gate structure over the epitaxial layer; forming a source region and a drain region, wherein the source region and the drain region are disposed in the epitaxial layer at opposite sides of the gate structure respectively; and forming a stack structure between the gate structure and the drain region, wherein the stack structure includes: a blocking layer; an insulating layer disposed over the blocking layer; and a conductive layer disposed over the insulating layer and electrically connected the source region or the gate structure.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
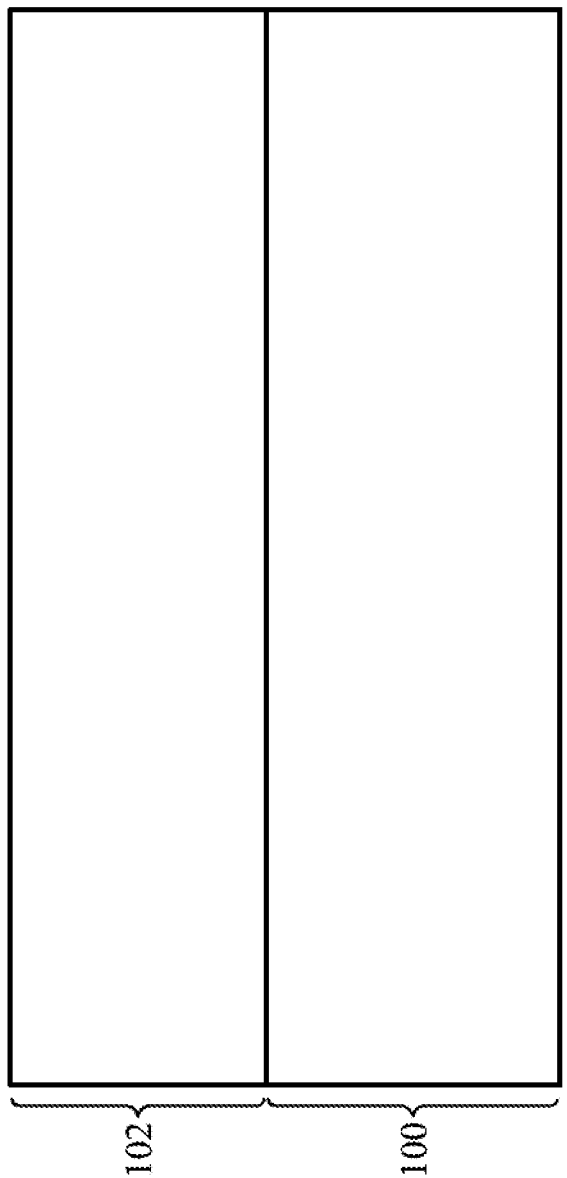
FIGS. 1-8 are cross-sectional views of high-voltage semiconductor device at various manufacturing stages in accordance with some embodiments of the present disclosure.

The high-voltage semiconductor device of the present disclosure is described in detail in the following description. In the following detailed description, for purposes of explanation, numerous specific details and embodiments are set forth in order to provide as thorough understanding of the present disclosure. The specific elements and configurations described in the following detailed description are set forth in order to clearly describe the present disclosure. It will be apparent, however, that the exemplary embodiments set forth herein are merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the like and/or corresponding numerals in the drawings of different embodiments does not suggest any correlations between different embodiments. In addition, in this specification, expressions such as "first insulating bump disposed on/over a second material layer", may indicate not only the direct contact of the first insulating bump and the second material layer, but also, a non-contact state with one or more intermediate layers between the first insulating bump and the second material layer. In the above situation, the first insulating bump may not directly contact the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate not only that the layer directly contacts the other layer, but also that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

The present disclosure utilizes a stack structure to decrease the electric field density in the channel, which in turn decreases the on-resistance ($R_{on}$) of the high-voltage semiconductor device.

Referring to FIG. 1A, a substrate 100 is provided first. The substrate 100 may include, but is not limited to, semiconductor substrate such as a silicon substrate. In addition, the substrate 100 may include an element semiconductor which may include germanium: compound semiconductor which may include silicon carbide, gallium arsenide, gallium phosphide, indium phosphide, indium arsenide and/or indium antimonide, alloy semiconductor which may include, SiGe alloy, GaAsP alloy, AlInAs alloy, AlGaAs alloy, GaInAs alloy, GaInP alloy and/or GaInAsP alloy, or a combination thereof. In addition, the substrate 100 may include semiconductor-on-insulator. In one embodiment, the substrate 100 may be an un-doped substrate. However, in other embodiments, the substrate 100 may be a lightly doped substrate such as a lightly doped P-type substrate or a lightly doped N-type substrate.

Next, an epitaxial layer 102 is formed over the substrate 100. The epitaxial layer 102 may include, but is not limited to, Si, Ge, Si/Ge, III-V compound, or a combination thereof. The epitaxial layer 102 may be formed by epitaxial growth step, such as metalorganic chemical vapour deposition (MOCVD), metalorganic vapour phase epitaxy (MOVPE), plasma-enhanced chemical vapour deposition (PECVD), remote plasma-enhanced chemical vapor deposition (RP-CVD), molecular beam epitaxy (MBE), hydride vapour phase epitaxy (HVPE), liquid phase epitaxy (LPE), chloride vapour phase epitaxy (Cl-VPE), or any other suitable methods.

The epitaxial layer 1077 has a first conductive type. For example, when the first conductive type is P-type, the epitaxial layer 102 is a P-type epitaxial layer. The P-type epitaxial layer may be formed by adding borane ($BH_3$) or boron tribromide ($BBr_3$) into the reaction gas to perform in-situ doping when depositing the epitaxial layer 102. Alternatively, the un-doped epitaxial layer 102 may be deposited first, then the un-doped epitaxial layer 102 is ion-implanted by boron ion or indium ion.

Figure 2:
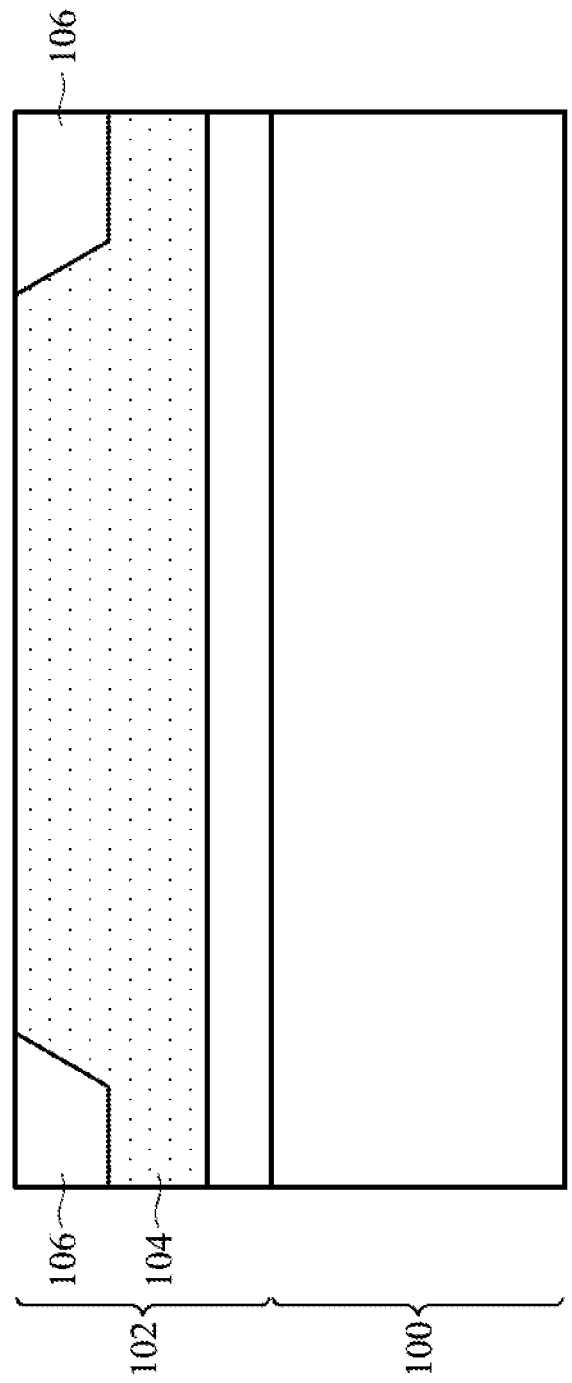

Next, referring to FIG. 2, before the subsequent gate structure is formed, a high-voltage well region 104 may optionally be formed in the epitaxial layer 102. The high-voltage well region 104 has the second conductive type, and the first conductive type is different from the second conductive type. The high-voltage well region 104 may be formed by ion implantation. For example, when the second conductive type is N-type, the predetermined region for the high-voltage well region 104 may be implanted with phosphorous ions or arsenic ions to form the high-voltage well region 104.

Then a trench isolation structure 106 may be formed in the epitaxial layer 102 by a shallow trench isolation step to isolate an active region in the substrate 100. However, the active region may be isolated by any other suitable method. For example, the active region in substrate 100 may be isolated by a field oxide layer formed by a local-oxidation of silicon (LOCOS).

Figure 3:
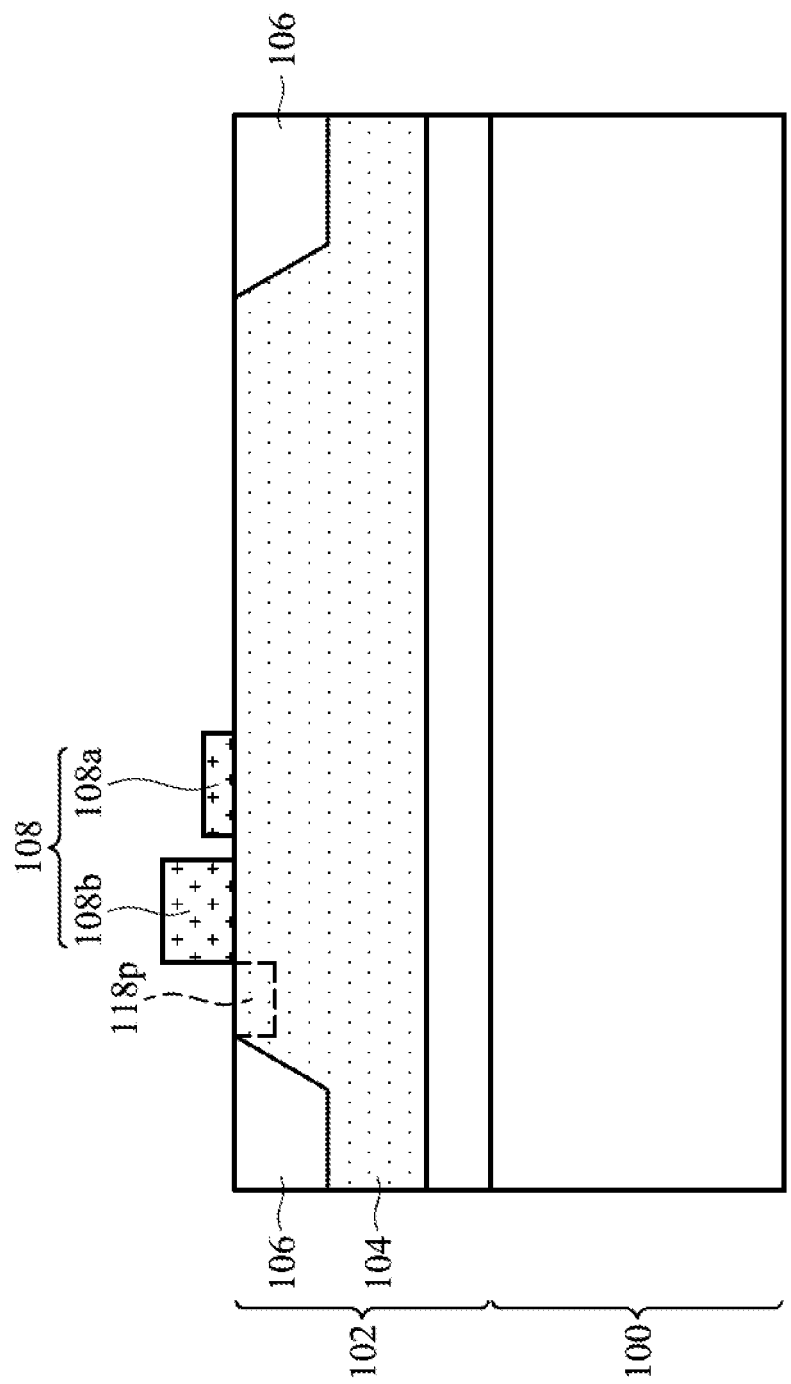

Next, referring to FIG. 3, before the subsequent gate structure is formed, a plurality of insulating bumps 108, for example the insulating bumps 108a and 108b, may optionally be formed over the epitaxial layer 102. The insulating bumps 108 are disposed between the subsequent gate structure and the drain region (namely the predetermined drain region 118P in FIG. 3) to further decrease the electric field density in the channel in the epitaxial layer 102 under the insulating bumps, which in turn decreases the on-resistance ($R_{on}$) of the device. This will be described in detail in the following description.

In addition, the substrate at the left side is the predetermined drain region 118P, and the insulating bump 108 which is closer to the predetermined drain region 118P has a greater height. For example, as shown in FIG. 3, the insulating bump 108b, which is closer to the predetermined drain region 118P, has a greater height than the insulating bump 108a, which is farther from the predetermined drain region 118P. The height variation of the insulating bumps may further decrease the electric field density in the channel in the epitaxial layer 102 under the insulating bumps, which in turn decreases the on-resistance ($R_{on}$) of the device.

The insulating bumps 108 may include, but are not limited to, silicon oxide, silicon nitride, silicon oxynitride formed chemical vapor deposit (CVD), any other suitable insulating materials, or a combination thereof. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

It should be noted that, although FIG. 3 merely illustrate two insulating bumps 108a and 108b, the high-voltage semiconductor device of the present disclosure may also include more than two insulating bumps, or only one insulating bump. Alternatively, the high-voltage semiconductor device of the present disclosure may not include any insulating bump. This will be described in detail in the following description. It should be noted that the exemplary embodiment set forth in FIG. 3 is merely for the purpose of illustration, the inventive concept may be embodied in various forms without being limited to the exemplary embodiments.

Figure 4:
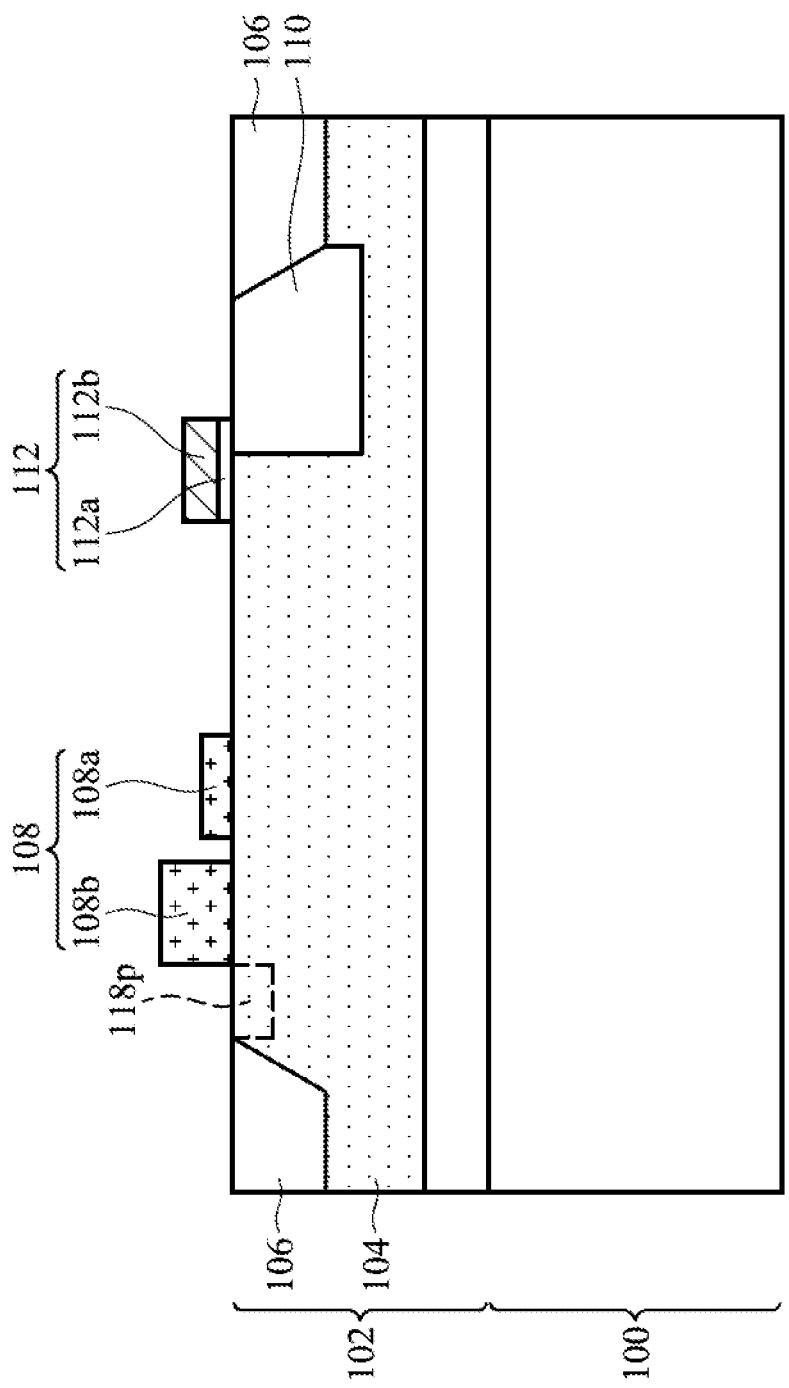

Next, referring to FIG. 4, a gate structure 112 is formed over the epitaxial layer 102, and a first conductive type doping region 110 is formed in the high-voltage well region 104. The gate structure 112 includes as gate dielectric layer 112a and a gate electrode 112b disposed over the gate dielectric layer 112a. In addition, the first conductive type doping region 110 is formed before the subsequent source region.

In one embodiment, a dielectric material layer (not shown, for forming the gate dielectric layer 112a) and a conductive material layer (not shown, for forming the gate electrode 112b) thereon may be blanketly deposited over substrate 100 sequentially. Then the predetermined region of the high-voltage well region 104 (or the epitaxial layer 102) for forming the first conductive type doping region 110 is exposed from the dielectric material layer and the conductive material layer through photolithography and etch steps. Next, the first conductive type doping region 110 is formed by performing ion implantation. Subsequently, the gate dielectric layer 112a and the gate electrode 112b are respectively formed from the dielectric material layer and the conductive material layer by patterning the above two layers through another photolithography and etch steps.

The material of the dielectric mater 41 layer (i.e. the material of the gate dielectric layer 112a) may include, but is not limited to, silicon oxide, silicon nitride, silicon nitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof. The dielectric material layer may be formed by the previously described chemical vapour deposition or spin-on coating.

The material of the conductive material layer (i.e. the material of the gate electrode 112b) may include, but is not limited to, amorphous silicon, poly-silicon, one or more metal, metal nitride, conductive metal oxide, or a combination thereof. The metal may include, but is not limited to, molybdenum tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The conductive material layer may be formed by the previous described chemical vapour deposition (CVD), sputtering, resistive thermal evaporation, electron beam evaporation, or any other suitable methods. For example, in one embodiment, the amorphous silicon conductive material layer or poly-silicon conductive material layer may be deposited and formed by low-pressure chemical vapor deposition at about 525° C.~650° C. The thickness of the amorphous silicon conductive material layer or poly-silicon conductive material may range from about 1000 Å to 10000 Å.

Then referring to an insulating sidewall layer 114 is formed over the side ails of the gate structure 112. In some embodiments, an insulating layer, for example silicon oxide or silicon nitride, with a thickness ranging from about 200 Å to 2000 Å may be deposited by low-pressure chemical vapor deposition or plasma-enhanced chemical vapour deposition at about 350° C.~850° C. Alternatively, when the insulating sidewall layer 114 is a composite sidewall layer, more than one insulating layer may be deposited. After the deposition, $SF_6$, $CF_4$, $CHF_3$ or $C_2F_6$ are used as an etchant and an anisotropic etching is performed by a reactive ion etching step to form the insulating sidewall layer 114 over the sidewalls of the gate structure 112.

Figure 5:
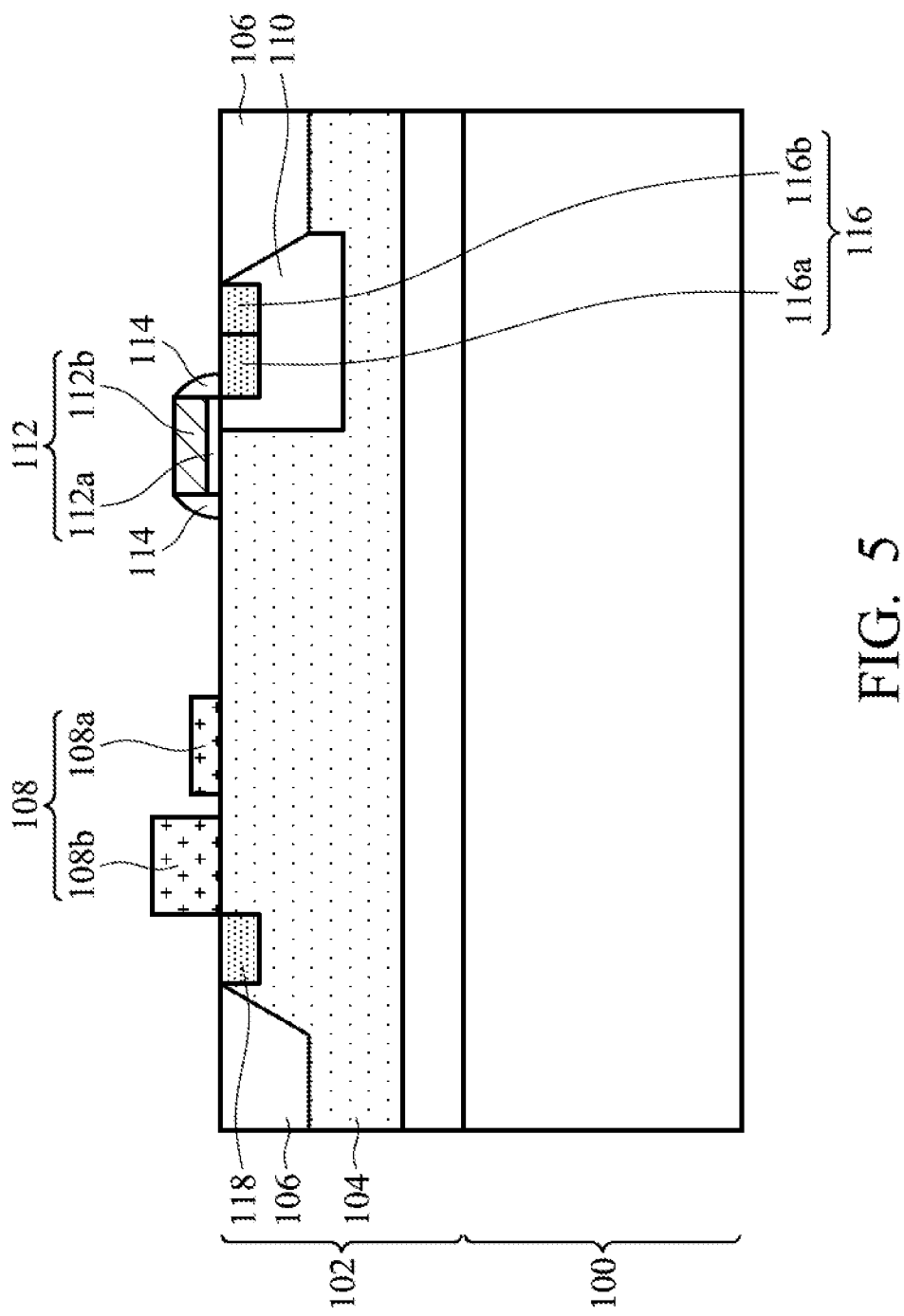

Still referring to FIG. 5, after the insulating sidewall layer 114, a source region 116 and a drain region 118 are formed. The source region 116 and the drain region 118 are disposed in the epitaxial layer 102 at opposite sides of the gate structure 112 respectively. Specifically, the source region 116 is disposed in the first conductive type doping region 110, and the drain region 118 is disposed in the region of the high-voltage well region 104 where no first conductive type doping region 110 is formed in. The source region 116 and the drain region 118 may be formed by ion implantation. In addition, the source region 116 may include a second conductive type source region 116a and a first conductive type source region 116b.

Figure 6:
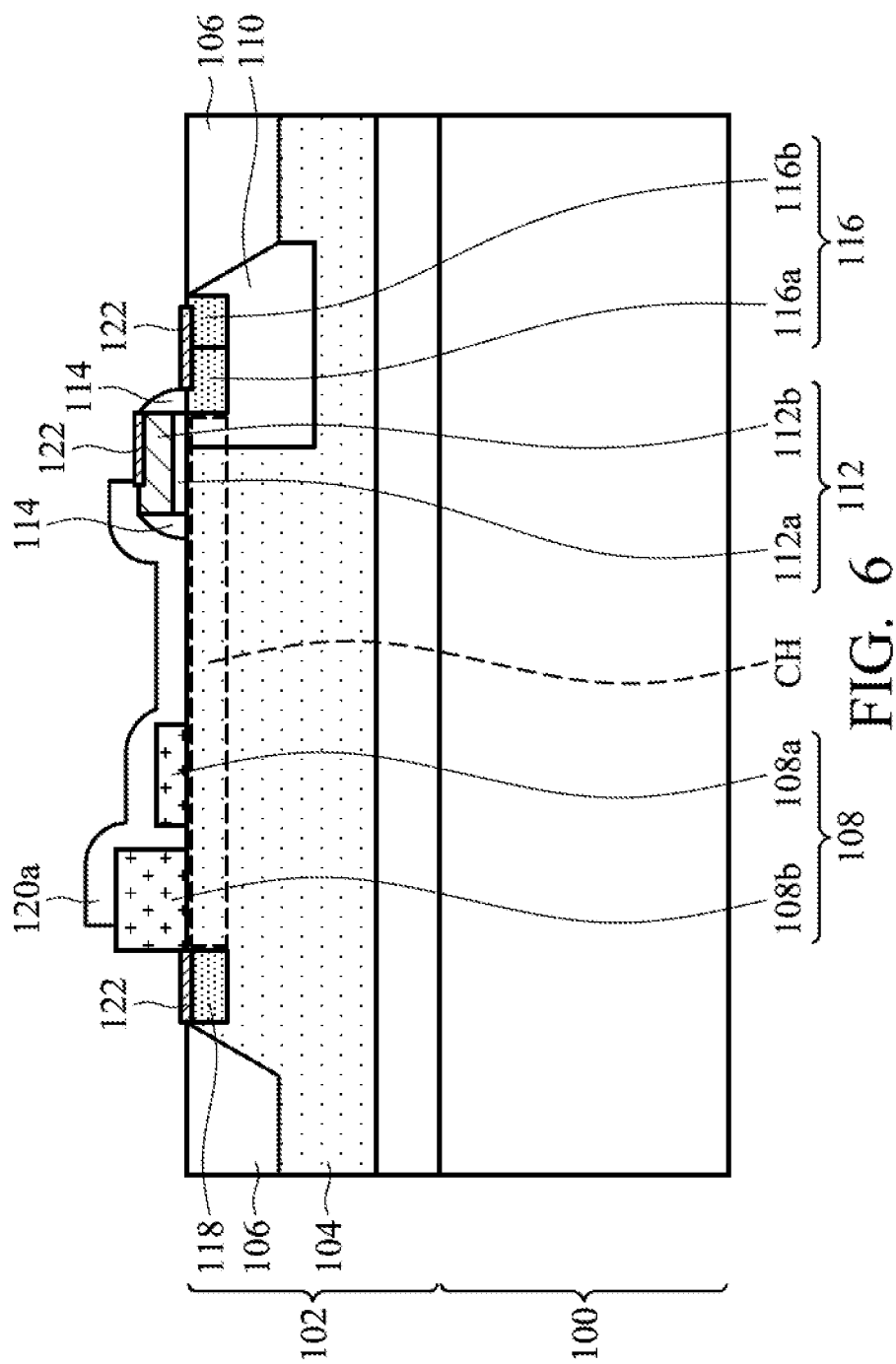
Figure 7:
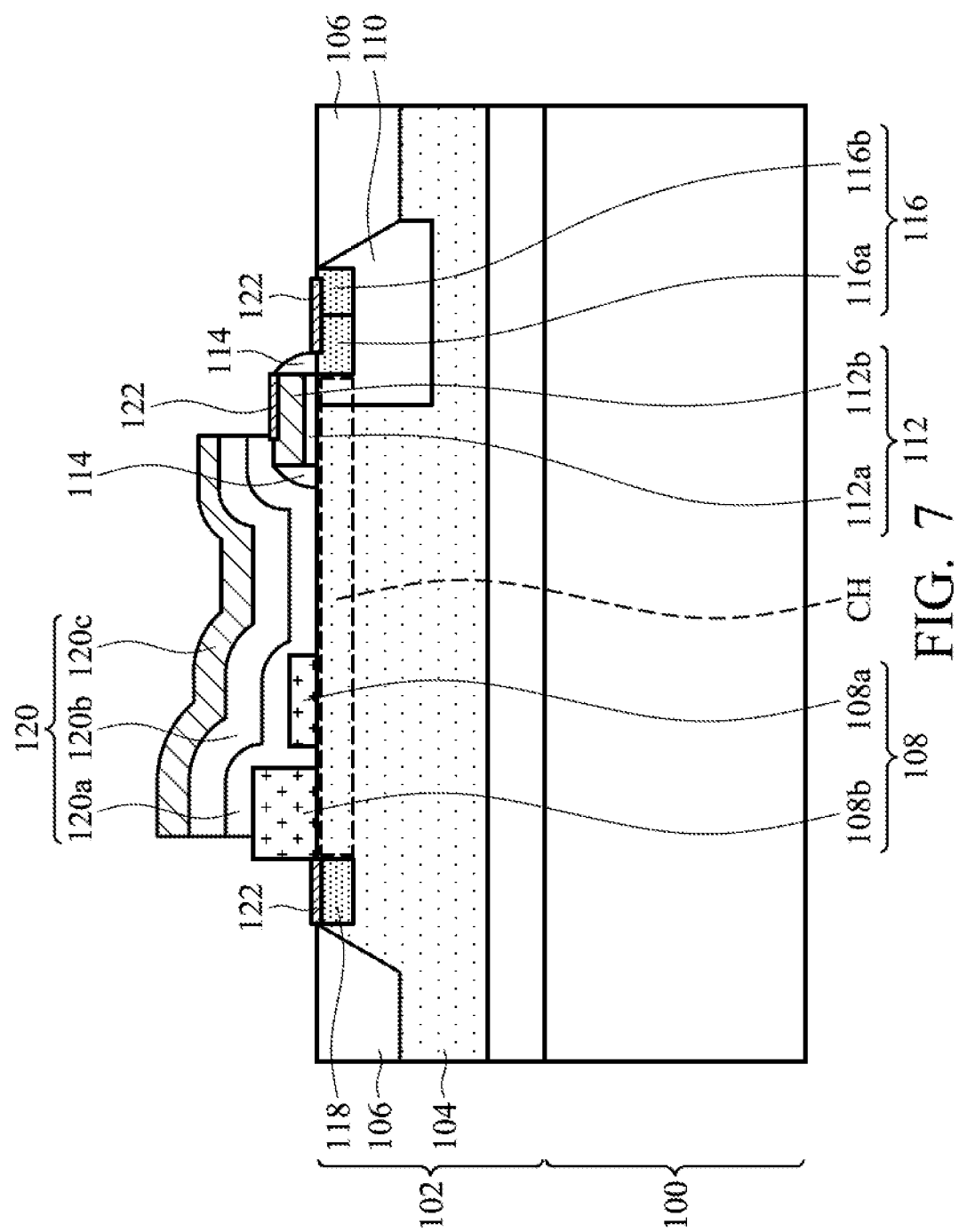

Next, referring to FIGS. 6-7, a stack structure 120 is formed between the gate structure 112 and the drain region 118, The stack structure 120 includes a sequentially stacked blocking layer 120a, an insulating layer 120b and a conductive layer 120c. The conductive layer 120c is electrically connected to the source region 116 or the gate structure 112 through a subsequent interconnection structure such that the stack structure 120 may decrease the electric field density of the channel CH in the epitaxial layer 102 under the stack structure 120, which in turn decreases the on-resistance ($R_{on}$) of the high-voltage semiconductor device.

In the stack structure 120, the insulating layer 120b is disposed over the blocking layer 120a, and the conductive layer 120c is disposed over the insulating layer 120b. In one embodiment, referring to FIG. 6, the blocking layer 120a is formed over the epitaxial layer 102 between the gate structure 112 and the drain region 118 first. The blocking layer 120a conformally covers a portion of the insulating bump 108b and a portion of the gate structure 112, and completely covers the insulating bump 108a. The blocking layer 120a is used to cover the portion of the gate structure 112 where the formation of metal silicide is undesired. Therefore, the portion of the gate structure 112 covered by the blocking layer 120a will not contact metal to form metal silicide in the subsequent metal silicidation step. The material of the blocking layer 120a may include, but is not limited to, silicon oxide, silicon nitride, silicon oxynitride formed by chemical vapor deposition (CVD), any other suitable insulating materials, or a combination thereof.

Then, a metal silicidation step may optionally be performed to form a metal silicide layer 122 at the exposed surface of the source region 116, the drain region 118 and the gate structure 112. The metal silicide layer 122 may further decrease the on-resistance of the device. The material of the metal silicide layer 122 may include, but is not limited to, nickel silicide, cobalt silicide, tungsten silicide, titanium silicide, tantalum silicide, platinum silicide or erbium silicide.

Next, Referring to FIG. 7, the insulating layer 120b is formed over the blocking layer 120a. The insulating layer 120b is used to insulate the conductive layer 120c from the blocking layer 120a and the epitaxial layer 102 thereunder. The material of the insulating layer 120b may include, but is not limited to, oxide, nitride, oxynitride, low-k material, any other suitable insulating material, or a combination thereof. In addition, the insulating layer 120b may be formed by the previous described chemical vapor deposition.

Subsequently, the conductive layer 120c is formed over the insulating layer 120b to complete the stack structure 120. The material of the conductive layer 120c may include, but is not limited to, metal, metal oxide, metal nitride, metal alloy, metal silicide, any other suitable conductive material, or a combination thereof. In addition, the stack structure 120 conformally covers a portion of the gate structure 112. According to the previous description, the conductive layer 120c enable the stack structure 120 to decrease the electric field density of the channel CH in the epitaxial layer 102 under the stack structure 120, which in turn decreases the on-resistance of the high-voltage semiconductor device.

In addition, since the distance from the conductive layer 120c of the stack structure 120 to the channel CH in the epitaxial layer 102 may be varied and increased due to the insulating bumps 108a and 108b, the effect of the conductive layer 120c on the electric field in the channel CH may be varied. Therefore, the insulating bumps 108a and 108b may further decrease the electric field density of the channel CH in the epitaxial layer 102 under the insulating bumps 108a and 108b, which in turn decreases the on-resistance of the device. Furthermore, as the insulating bump 108 closer to the drain region 118 has a greater height, the effect of the conductive layer 120c on the electric field in the channel CH may vary continuously; therefore, the electric field density of the channel CH in the epitaxial layer 102 and the on-resistance of the device may be further decreased.

It should be noted that although the stack structure 120 in FIG. 7 partially covers the insulating bump 108b, and completely covers the insulating bump 108a, those skilled in the art will appreciate that when the high-voltage semiconductor device of the present disclosure includes more insulating bumps 108, the stack structure 120 partially covers the insulating bump 108 which is most adjacent to the drain region 118 and completely covers other the insulating bumps 108. It should be noted that the exemplary embodiment set forth in FIG. 7 is merely for the purpose of illustration, and the inventive concept may be embodied in various forms without being limited to the exemplary embodiments.

Figure 8:
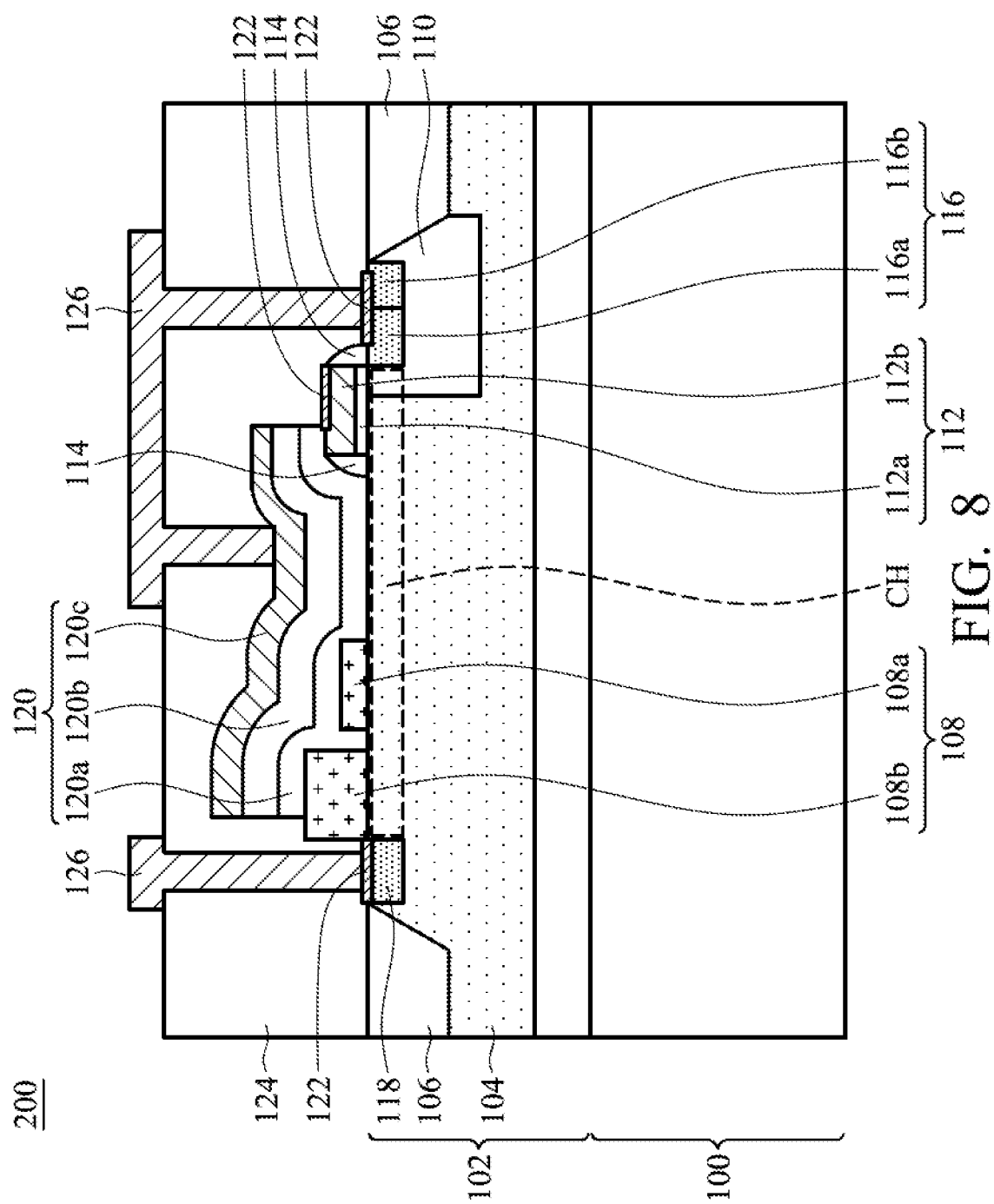

Referring to FIG. 8, an interlayer dielectric (ILD) layer 124 is formed. The interlayer dielectric layer 124 may include, but is not limited to, silicon oxide, silicon nitride, silicon oxynitride, borophosphosilicate glass (BPSG), phosphosilicate glass (PSG), spin-on-glass (SOG), dielectric material formed by high-density plasma (HDP) deposition, any other suitable dielectric material, or to combination thereof. The interlayer dielectric layer 124 may be formed by the previously described chemical vapour deposition or spin-on coating and patterning process.

Next, an interconnection structure 126 is formed in the interlayer dielectric layer 124 to form the high-voltage semiconductor device 200. The material of the interconnection structure 126 may include, but is not limited to, Cu, Al, W, doped poly-Si, any other suitable conductive materials, or a combination thereof. In the embodiment show in FIG. 8, the conductive layer 120c is electrically connected to the source region 116 through the interconnection structure 126, and the conductive layer 120c is electrically isolated from the gate structure 112. However, in other embodiments, the conductive layer 120c electrically connects the gate structure 112 through the interconnection structure 126, and the conductive layer 121c is electrically isolated from the source region 116. This will be described in detail in the following description.

Referring to FIG. 8, the high-voltage semiconductor device 200 of the present disclosure includes the substrate 100 and the epitaxial layer 102 disposed over the substrate 100 and having a first conductive type. The gate structure 112 is disposed over the epitaxial layer 102. The source region 116 and the drain region 118 are disposed in the epitaxial layer 102 at opposite sides of the gate structure 112 respectively. The stack structure 120 is disposed between the gate structure 112 and the drain region 118, and the stack structure 120 includes the lowermost blocking layer 120a, the insulating layer 120b disposed over the blocking layer 120a and the conductive layer 120c disposed over the insulating layer 120b. The conductive layer 120c electrically connects the source region 116 or the gate structure 112.

In addition, the high-voltage semiconductor device 200 of the present disclosure may further include the high-voltage well region 104 disposed in the epitaxial layer 102 and having a second conductive type. The first conductive type is different from the second conductive type. The high-voltage semiconductor device 200 of the present disclosure may further include the first conductive type doping region 110 disposed in the high-voltage well region 104. The source region 116 is disposed in the first conductive type doping region 110, while the drain region 118 is disposed in the high-voltage well region 104. In addition, The high-voltage semiconductor device 200 may further include the plurality of the insulating bumps 108 disposed between the gate structure 112 and the drain region 118. The insulating bump 108 which is closer to the drain region 118 has a greater height.

Figure 9:
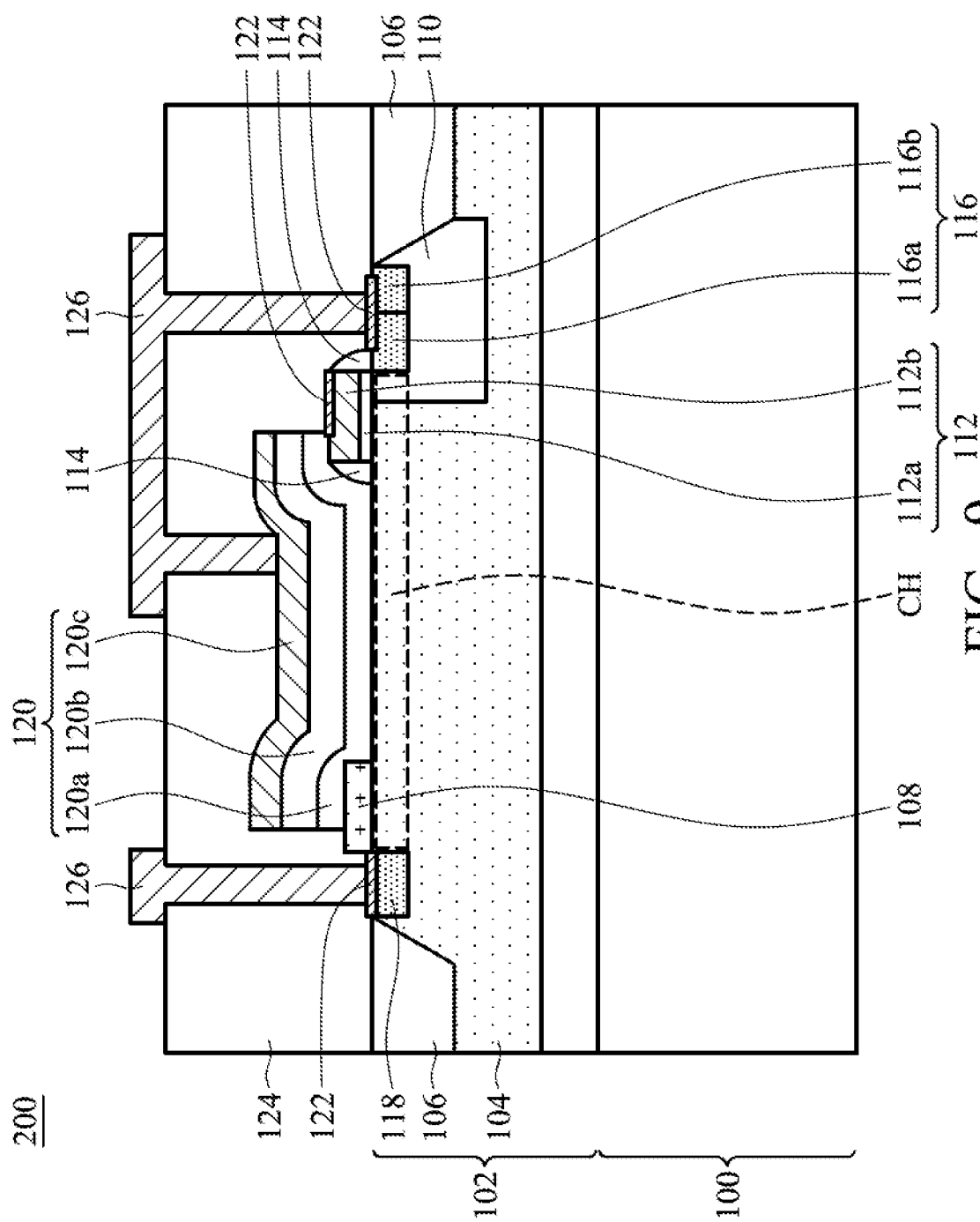
FIG. 9 is a cross-sectional view of an high-voltage semiconductor device in accordance with another embodiment of the present disclosure.
Figure 10:
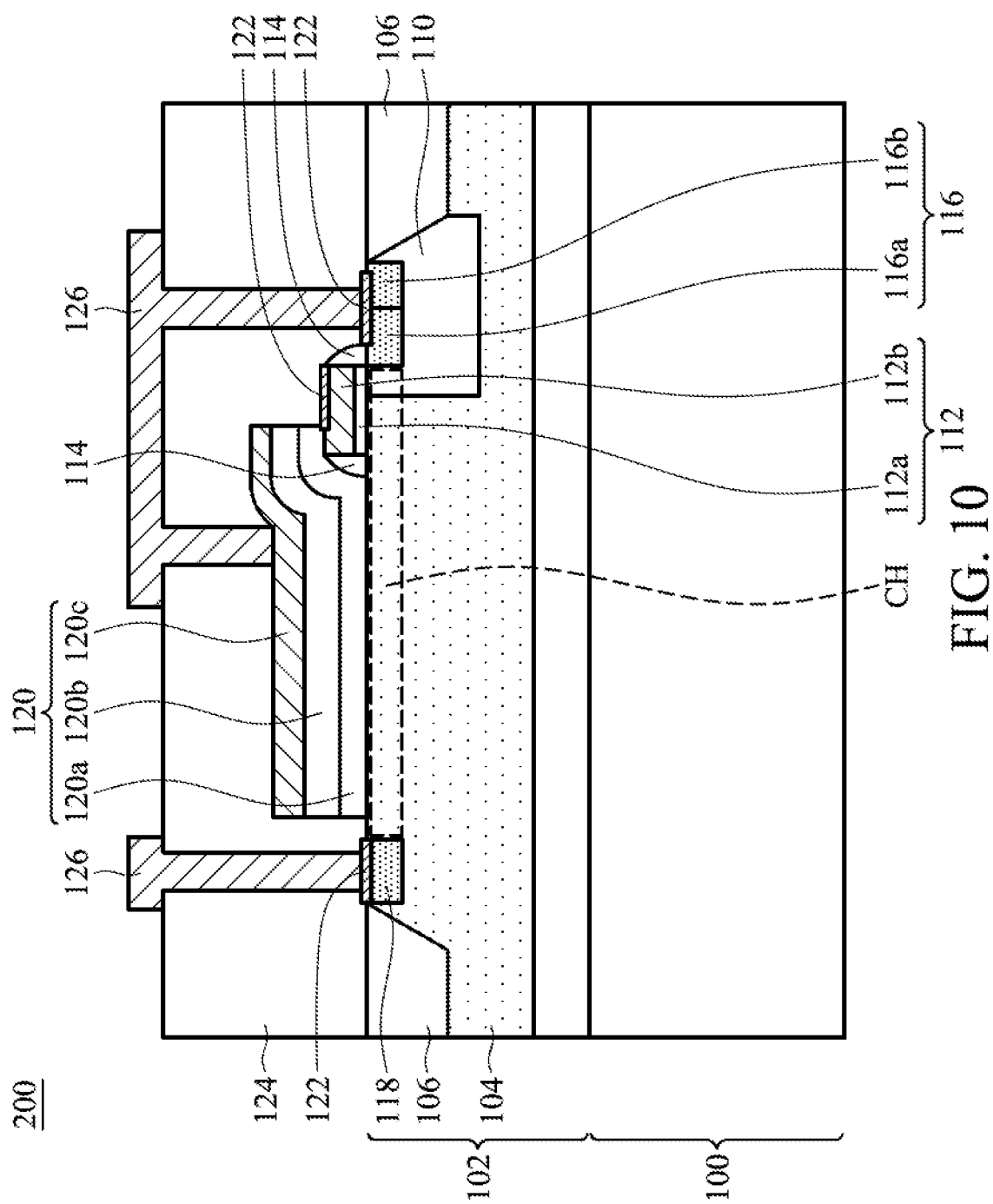
FIG. 10 is a cross-sectional view of an high-voltage semiconductor device in accordance with another embodiment of the present disclosure.

It should be noted that, although the above description merely illustrates the embodiment with two insulating bumps, those skilled in the art will appreciate that the high-voltage semiconductor device of the present disclosed may also include only one insulating bump or include no insulating bumps, as shown in the embodiments of FIGS. 9 and 10 respectively.

Referring to FIG. 9, which is a cross-sectional view of a high-voltage semiconductor device 200 in accordance with another embodiment of the present disclosure. As shown in FIG. 9, the high-voltage semiconductor device 200 may also include only one insulating bump 108 disposed between the gate structure 112 and the drain region 118. The stack structure 120 conformally covers a portion of the insulating bump 108. However, those skilled in the art will appreciate that the stack structure 120 may also completely cover the insulating bump 108.

Referring to FIG. 10, which is a cross-sectional view of an high-voltage semiconductor device 200 in accordance with another embodiments of the present disclosure. As shown in FIG. 10, the high-voltage semiconductor device 200 may not include an insulating bump.

Figure 11:
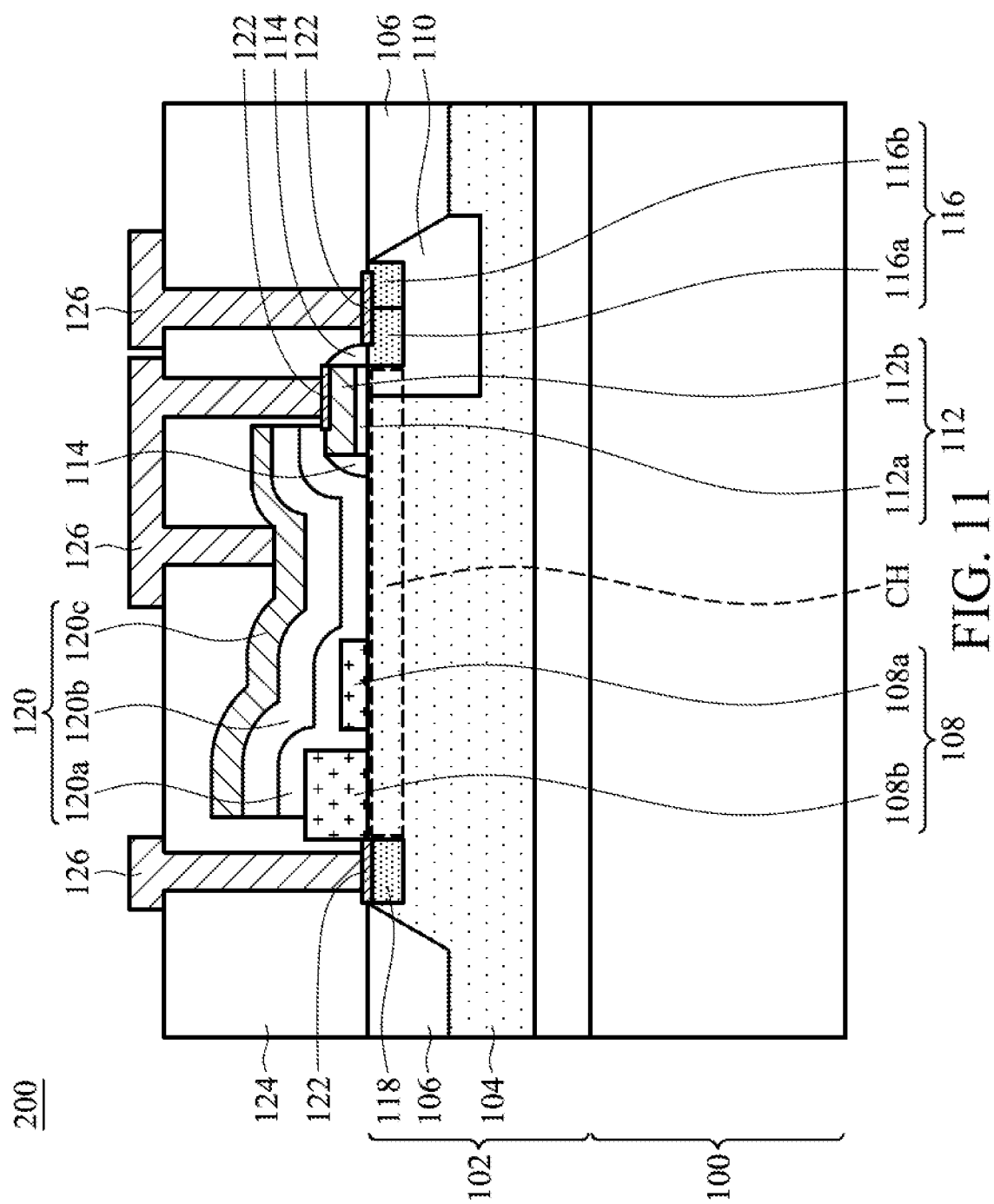
FIG. 11 is a cross-sectional view of an high-voltage semiconductor device in accordance with another embodiment of the present disclosure.

In addition, although the above embodiments merely illustrate that the conductive layer electrically connects the source region and is electrically isolated from the gate structure, those skilled in the art will appreciate that the conductive layer may also electrically connect the gate structure and be electrically isolated from the source region, as shown in the embodiment of FIG. 11.

Referring to FIG. 11, which is a cross-sectional of an high-voltage semiconductor device 200 in accordance with another embodiments of the present disclosure. As shown in FIG. 11, the conductive layer 120c electrically connects the gate structure 112 through the interconnection structure 126, and the conductive layer 120c is electrically isolated from the source region 116.

It should be noted that although the above description merely illustrates embodiments with the first conductive type being P-type and the second conductive type being N-type, those skilled in the art will appreciate that the first conductive type may be N-type with the second conductive type being P-type.

In summary, the present disclosure utilizes the stack structure including the conductive layer to decrease the electric field density of the channel in the epitaxial layer, which in turn decreases the on-resistance ($R_{on}$) of the high-voltage semiconductor device. In addition, the insulating bump disposed between the gate structure and the drain region may further decrease the on-resistance.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
    a substrate;
    an epitaxial layer disposed over the substrate and having a first conductive type;
    a gate structure disposed over the epitaxial layer;
    a source region and a drain region disposed in the epitaxial layer at opposite sides of the gate structure respectively;
    a first insulating bump disposed between the gate structure and the drain region, wherein a side of the drain region is aligned with a sidewall of the first insulating bump;
    a metal silicide layer disposed on the source region and on the gate structure, wherein the gate structure is in direct contact with the metal silicide layer thereon; and
    a stack structure having a first portion directly above the gate structure, a second portion directly above the first insulating bump, and a third portion between the first portion and the second portion, wherein the second portion is higher than the first portion, and the first portion is higher than the third portion, wherein the stack structure comprises:
        a blocking layer exposing the drain region;
        an insulating layer disposed over the blocking layer and exposing the drain region; and
        a conductive layer disposed over the insulating layer and electrically connected to the source region or the gate structure,
    wherein respective sides of the blocking layer, the insulating layer and the conductive layer are vertically aligned, the stack structure covers a portion of a top surface of the gate structure and the metal silicide layer covers another portion of the top surface of the gate structure, and the top surface of the gate structure, in its entirety, is directly covered by the stack structure and the metal silicide layer.

2. The semiconductor device as claimed in claim 1, further comprising:
    a well region disposed in the epitaxial layer and having a second conductive type, wherein the first conductive type is different from the second conductive type; and
    a first conductive type doping region disposed in the well region, wherein the source region is disposed in the first conductive type doping region, and the drain region is disposed in the well region.

3. The semiconductor device as claimed in claim 1, wherein the stack structure conformally covers a portion of the first insulating bump and does not cover another portion of the first insulating bump.

4. The semiconductor device as claimed in claim 1, further comprising a second insulating bump disposed between the gate structure and the first insulating bump, wherein the first insulating bump has a height greater than that of the second insulating bump, and the first insulating bump and the second insulating bump are spaced apart.

5. The semiconductor device as claimed in claim 3, wherein a material of the first insulating bump comprises oxide, nitride, oxynitride or a combination thereof.

6. The semiconductor device as claimed in claim 1, wherein the stack structure conformally covers a portion of the gate structure.

7. The semiconductor device as claimed in claim 1, further comprising:
    a dielectric layer over the substrate and covering the stack structure; and
    a first interconnection structure formed in and over the dielectric layer,
    wherein the conductive layer electrically connects to the gate structure through the first interconnection structure, and the conductive layer is electrically isolated from the source region.

8. The semiconductor device as claimed in claim 1, further comprising:
    a dielectric layer over the substrate and covering the stack structure; and
    a first interconnection structure formed in and over the dielectric layer and in direct contact with the third portion of the stack structure,
    wherein the conductive layer electrically connects to the source region through the first interconnection structure, and the conductive layer is electrically isolated from the gate structure.

9. The semiconductor device as claimed in claim 1, wherein a material of the blocking layer comprises oxide, nitride, oxynitride or a combination thereof.

10. The semiconductor device as claimed in claim 1, wherein a material of the insulating layer comprises oxide, nitride, oxynitride, low-k material or a combination thereof.

11. The semiconductor device as claimed in claim 1, wherein a material of the conductive layer comprises metal, metal oxide, metal nitride, metal alloy, metal silicide or a combination thereof.

12. A method for manufacturing the semiconductor device as set forth in claim 1, comprising:
    providing a substrate;
    forming an epitaxial layer over the substrate, wherein the epitaxial layer has a first conductive type;
    forming a gate structure over the epitaxial layer;
    forming a source region and a drain region, wherein the source region and the drain region are disposed in the epitaxial layer at opposite sides of the gate structure respectively;
    forming a metal silicide layer over the source region and not covering the entire source region; and
    forming a stack structure having a first portion between the gate structure and the drain region and a second portion disposed over the gate structure, wherein the stack structure comprises:
        a blocking layer exposing the drain region;
        an insulating layer disposed over the blocking layer and exposing the drain region; and
        a conductive layer disposed over the insulating layer and electrically connected to the source region or the gate structure.

13. The method for manufacturing the semiconductor device as claimed in claim 12, further comprising:
    before forming the gate structure, forming a well region in the epitaxial layer, wherein the well region has a second conductive type, and the first conductive type is different from the second conductive type; and before forming the source region, forming a first conductive type doping region in the well region, wherein the source region is disposed in the first conductive type doping region, and the drain region is disposed in the well region.

14. The method for manufacturing the semiconductor device as claimed in claim 12, further comprising:

before forming the gate structure, forming an insulating bump between the gate structure and the drain region, wherein the stack structure formed after the gate structure conformally covers a portion of the insulating bump.

15. The method for manufacturing the semiconductor device as claimed in claim 12, further comprising:

before forming the gate structure, forming a plurality of insulating bumps between the gate structure and the drain region, wherein for every two adjacent insulating bumps of the plurality of insulating bumps, the insulating bump of the two adjacent insulating bumps, which is closer to the drain region than the other insulating bump of the two adjacent insulating bumps, has a greater height than that of the other insulating bump.

16. The method for manufacturing the semiconductor device as claimed in claim 14, wherein a material of the insulating bump comprises oxide, nitride, oxynitride or a combination thereof.

17. The method for manufacturing the semiconductor device as claimed in claim 12, wherein the stack structure conformally covers a portion of the gate structure.

18. The method for manufacturing the semiconductor device as claimed in claim 12, further comprising:

forming a dielectric layer over the substrate and covering the stack structure; and forming a first interconnection structure in and over the dielectric layer, wherein the conductive layer electrically connects to the gate structure through the first interconnection structure, and the conductive layer is electrically isolated from the source region.

19. The method for manufacturing the semiconductor device as claimed in claim 12, further comprising:

forming a dielectric layer over the substrate and covering the stack structure; and forming a first interconnection structure in and over the dielectric layer, wherein the conductive layer electrically connects to the source region through the first interconnection structure, and the conductive layer is electrically isolated from the gate structure.

20. The method for manufacturing the semiconductor device as claimed in claim 12, wherein a material of the blocking layer comprises oxide, nitride, oxynitride or a combination thereof.

21. The method for manufacturing the semiconductor device as claimed in claim 12, wherein a material of the insulating layer comprises oxide, nitride, oxynitride, low-k material or a combination thereof.

22. The method for manufacturing the semiconductor device as claimed in claim 12, wherein a material of the conductive layer comprises metal, metal oxide, metal nitride, metal alloy, metal silicide or a combination thereof.

23. A semiconductor device, comprising:

a substrate;

an epitaxial layer disposed over the substrate and having a first conductive type;

a gate structure disposed over the epitaxial layer;

a source region and a drain region disposed in the epitaxial layer at opposite sides of the gate structure respectively;

an insulating bump disposed between the gate structure and the drain region, wherein a side of the drain region is aligned with a sidewall of the insulating bump;

a metal silicide layer disposed on the gate structure, wherein the gate structure is in direct contact with the metal silicide layer thereon;

a well region disposed in the epitaxial layer and having a second conductive type, wherein the first conductive type is different from the second conductive type;

a first conductive type doping region disposed in the well region, wherein the source region is disposed in the first conductive type doping region, and the drain region is disposed in the well region; and a stack structure having a first portion directly above the gate structure, a second portion directly above the insulating bump, and a third portion between the first portion and the second portion, wherein the second portion is higher than the first portion, and the first portion is higher than the third portion, wherein the stack structure comprises:

a blocking layer exposing the drain region;

an insulating layer disposed over the blocking layer and exposing the drain region; and a conductive layer disposed over the insulating layer and electrically connected to the source region or the gate structure, wherein respective sides of the blocking layer, the insulating layer and the conductive layer are vertically aligned, the stack structure covers a portion of a top surface of the gate structure and the metal silicide layer covers another portion of the top surface of the gate structure, and the top surface of the gate structure, in its entirety, is directly covered by the stack structure and the metal silicide layer.

24. The semiconductor device as claimed in claim 4, wherein the first insulating bump is higher than the gate structure, and the gate structure is higher than the second insulating bump, wherein the gate structure, the first insulating bump and the second insulating bump are spaced apart by the stack structure.

* * * * *